United States Patent
Boochakorn et al.

(12)
(10) Patent No.: US 6,371,715 B1
(45) Date of Patent: Apr. 16, 2002

(54) AUTOMATED TUBE TO TUBE TRANSFER OF A PREDETERMINED NUMBER OF IC PACKAGES FOR VARIOUS TYPES OF IC PACKAGES

(75) Inventors: Sa-nguan Boochakorn, Bangkok (TH); Somboon Rungsawang, Cupertino, CA (US); Watcharin Pinlam, Pathumthanee (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 88 days.

(21) Appl. No.: 09/609,756

(22) Filed: Jul. 3, 2000

(51) Int. Cl.[7] .............................. B65G 69/00; B65H 3/30
(52) U.S. Cl. .............................. 414/404; 221/9; 221/13; 221/289; 221/298
(58) Field of Search ................................... 414/404, 810, 414/419, 421; 221/9, 13, 289, 298

(56) References Cited

U.S. PATENT DOCUMENTS

| | | | | |
|---|---|---|---|---|
| 4,993,588 A | * | 2/1991 | Willberg et al. | 221/13 |
| 5,503,299 A | * | 4/1996 | Smith | 221/289 X |
| 5,772,387 A | * | 6/1998 | Nakamura et al. | 414/404 |
| 6,074,158 A | * | 6/2000 | Yutaka et al. | 414/421 X |
| 6,199,720 B1 | * | 3/2001 | Rudick et al. | 221/298 X |
| 6,253,953 B1 | * | 7/2001 | Ishizuka | 221/13 |
| 6,254,332 B1 | * | 7/2001 | Miura et al. | 221/298 X |
| 6,264,415 B1 | * | 7/2001 | Boochakorn | 414/404 |

* cited by examiner

Primary Examiner—William A. Rivera
(74) Attorney, Agent, or Firm—Monica H. Choi

(57) ABSTRACT

A predetermined number of IC (integrated circuit) packages are transferred from a first IC package tube to a second IC package tube. A chosen IC package track has dimensions that fit to dimensions of each of the IC packages. The first IC package tube is placed on a first end of the chosen IC package track, and the second IC package tube is placed on a second end of the chosen IC package track. A stopper gate and a singulator are disposed above the chosen IC package track between the first end and the second end of the chosen IC package track. The first IC package tube, the chosen IC package track, and the second IC package tube are tilted to a slant with the first IC package tube being disposed toward a top of the slant and with the second IC package tube being disposed toward a bottom of the slant such that the IC packages slide out from the first IC package tube, down along the chosen IC package track, and toward the second IC package tube. The plurality of IC packages are lined up linearly against the stopper gate. A data processor controls the dropping down and the lifting up of the singulator and the stopper gate until the predetermined number of IC package are transferred to the second IC package tube. In another embodiment of the present invention, the chosen IC package track is part of a turret having a plurality of IC package tracks. Each IC package track has respective dimensions to fit to dimensions of a corresponding type of IC package. The length of the turret is disposed between the first IC package tube and the second IC package tube. The turret is rotated about the length of the turret until the chosen IC package track faces the stopper gate and the singulator.

19 Claims, 9 Drawing Sheets

AUTOMATED TUBE TO TUBE TRANSFER OF A PREDETERMINED NUMBER OF IC PACKAGES FOR VARIOUS TYPES OF IC PACKAGES

TECHNICAL FIELD

The present invention relates generally to manufacture of IC (integrated circuit) packages, and more particularly, to a mechanism for automatically transferring a predetermined number of IC packages from one tube to another tube for various types of IC packages using a turret having a plurality of IC package tracks of various dimensions.

BACKGROUND OF THE INVENTION

Referring to FIG. 1, during manufacture of IC (integrated circuit) packages, the IC packages are transported in an IC package tube 20. Plugs are wedged into the ends of the IC package tube 20 including a first plug 22 at one end of the tube 20 and a second plug 24 at the other end of the tube 20. The tube 20 may be comprised of steel or plastic, and such tubes are known to one of ordinary skill in the art of IC package manufacture. Referring to FIG. 1, the IC package tube 20 contains a first IC package 32, a second IC package 34, a third IC package 36, and a fourth IC package 38. An IC package tube typically contains more numerous IC packages, but four IC packages 32, 34, 36, and 38 are shown within the IC package tube 20 in FIG. 1 for clarity of illustration.

Referring to FIG. 2A, a typical IC (Integrated Circuit) package 102 includes a plurality of leads for coupling nodes of an IC die within the IC package 102 to a system external to the IC package 102. FIG. 2A shows a bottom view of the IC package 102. A first side 104 of the IC package 102 includes a first lead 106, a second lead 108, and a third lead 110. A second side 112 of the IC package 102 includes a fourth lead 114, a fifth lead 116, and a sixth lead 118. A third side 120 of the IC package 102 includes a seventh lead 122, an eighth lead 124, and a ninth lead 126. A fourth side 128 of the IC package 102 includes a tenth lead 130, an eleventh lead 132, and a twelfth lead 134. A typical IC package includes more numerous leads to a side of the IC package. However, three leads to a side of the IC package 102 are shown in FIG. 2A for clarity of illustration.

Referring to FIG. 2B, a side view of the first side 104 of the IC package 102 of FIG. 2A is shown. The side view of the first side 104 of the IC package 102 in FIG. 2B also shows a side view of the fourth lead 114 on the second side 112 of the IC package 102 and a side view of the twelfth lead 134 on the fourth side 128 of the IC package 102.

During manufacture of IC packages, the IC packages are transferred from one tube to another tube. It is desirable to transfer the IC packages in proper orientation. Referring to FIG. 2B, a tapered facet 150 is typically included on an IC package to indicate the proper orientation of the IC package. For example, referring to FIGS. 1 and 2B, the tapered facet of each of the IC packages 32, 34, 36, and 38 faces toward the right and toward the bottom of the tube 20 for proper orientation.

During transfer of IC packages from tube to tube, a first IC package tube containing the IC packages to be transferred is placed on a first end of an IC package track. A second IC package tube to receive the IC packages is placed on a second end of the IC package track. The first IC package tube, the IC package track, and the second IC package tube are then slanted such that the IC packages slide out from the first IC package tube, along the IC package track, and then into the second IC package tube. The IC package track confines the IC packages to slide along the IC package track and into the second IC package tube. Such mechanisms for tube to tube transfer of the IC packages is known to one of ordinary skill in the art of IC package manufacture.

It may be desired to transfer only a predetermined number of IC packages from tube to tube such as when a customer specifies the predetermined number of IC packages to be shipped to that customer. In the prior art, an operator may manually count the number of IC packages transferred from tube to tube. However, such manual count of the number IC packages may be prone to human error resulting in too few or too many IC packages that are transferred. Thus, a mechanism is desired for automatically controlling the number of IC packages that are transferred from tube to tube.

In addition, various types of IC packages which house IC dies of various sizes have various different dimensions. Thus, when a second type of IC packages having a second set of dimensions are transferred from tube to tube, a second IC package track corresponding to the second set of dimensions of the second type of IC packages is installed in the prior art mechanism for tube to tube transfer of the IC packages. Such installation of another IC package track for each type of IC packages may be time consuming and may result in significant down time during manufacture of IC packages. Thus, a mechanism is desired for rapidly changing the IC package track for different dimensions of various types of IC packages that are transferred from tube to tube.

SUMMARY OF THE INVENTION

Accordingly, in one embodiment of the present invention, a data processor controls a singulator and a stopper gate disposed near the IC package track to lift up or drop down for automatically controlling the number of IC packages transferred tube to tube. In another embodiment of the present invention, a turret having a plurality of IC package tracks is used such that IC packages of various dimensions may be transferred tube to tube.

A predetermined number of IC (integrated circuit) packages are transferred from a first IC package tube to a second IC package tube. A chosen IC package track has dimensions that fit to dimensions of each of the IC packages. The first IC package tube is placed on a first end of the chosen IC package track, and the second IC package tube is placed on a second end of the chosen IC package track.

A stopper gate is disposed above the chosen IC package track between the first end and the second end of the chosen IC package track. The first IC package tube, the chosen IC package track, and the second IC package tube are tilted to a slant with the first IC package tube being disposed toward a top of the slant and with the second IC package tube being disposed toward a bottom of the slant such that the IC packages slide out from the first IC package tube, down along the chosen IC package track, and toward the second IC package tube. The stopper gate is dropped down toward the chosen IC package track to block the IC packages from entering into the second IC package tube such that the IC packages are lined up linearly along the chosen IC package track against the stopper gate with a bottom IC package abutting the stopper gate.

A data processor is coupled to the stopper gate for controlling the stopper gate to lift up to pass the bottom IC package to the second IC package tube. A singulator is coupled to the stopper gate and to the data processor, and the data processor controls the singulator to drop down to hold a subsequent IC package adjacent the bottom IC package when the stopper gate is lifted up to pass the bottom IC package such that the subsequent IC package does not pass to the second IC package tube as the bottom IC package is passed to the second IC package tube. The data processor controls the stopper gate to drop back down and the singulator to lift back up after the bottom IC package is passed to the second IC package tube such that the subsequent IC package becomes the bottom IC package abutting the stopper gate.

The data processor controls the stopper gate and the singulator to repeat the lifting up and the dropping down process until the predetermined number of IC packages are passed to the second IC package tube. In this manner, the data processor automatically controls the transfer of the predetermined number of IC packages from the first IC package tube to the second IC package tube.

In another embodiment of the present invention, the chosen IC package track is part of a turret having a plurality of IC package tracks. A length of each IC package track is disposed along a length of the turret, and each IC package track is disposed at a respective location around a perimeter area of the turret. Each IC package track has respective dimensions to fit to dimensions of a corresponding type of IC package. The length of the turret is disposed between the first IC package tube and the second IC package tube. The turret is rotated about the length of the turret until the chosen IC package track faces the stopper gate and the singulator. In this manner, the IC package track corresponding to a particular type of IC packages is rapidly set by simply rotating the turret.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 1:
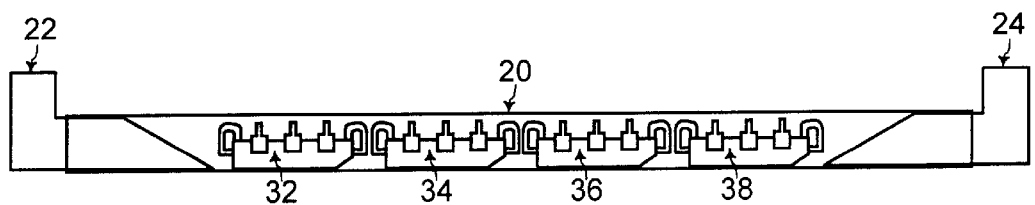
FIG. 1 shows an example IC (integrated circuit) package tube containing a plurality of IC packages.
Figure 2A:
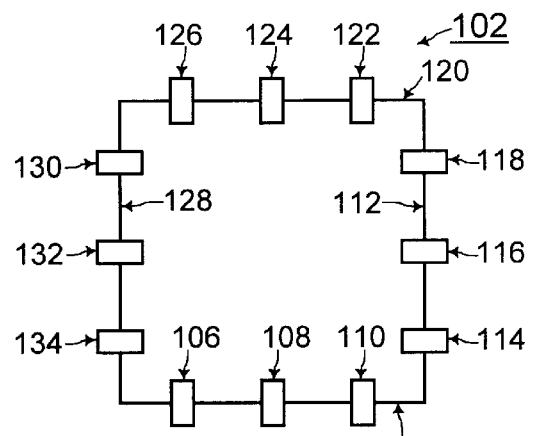
FIG. 2A shows a plurality of leads at the bottom of an example IC package.
Figure 2B:
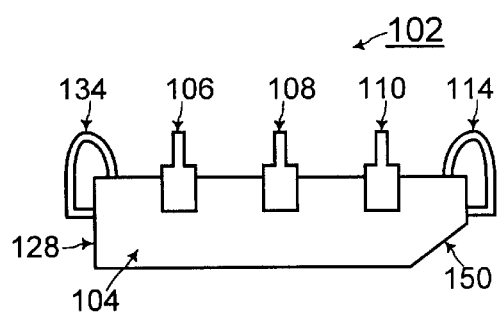
FIG. 2B shows a side view of the IC package of FIG. 2A.
Figure 3:
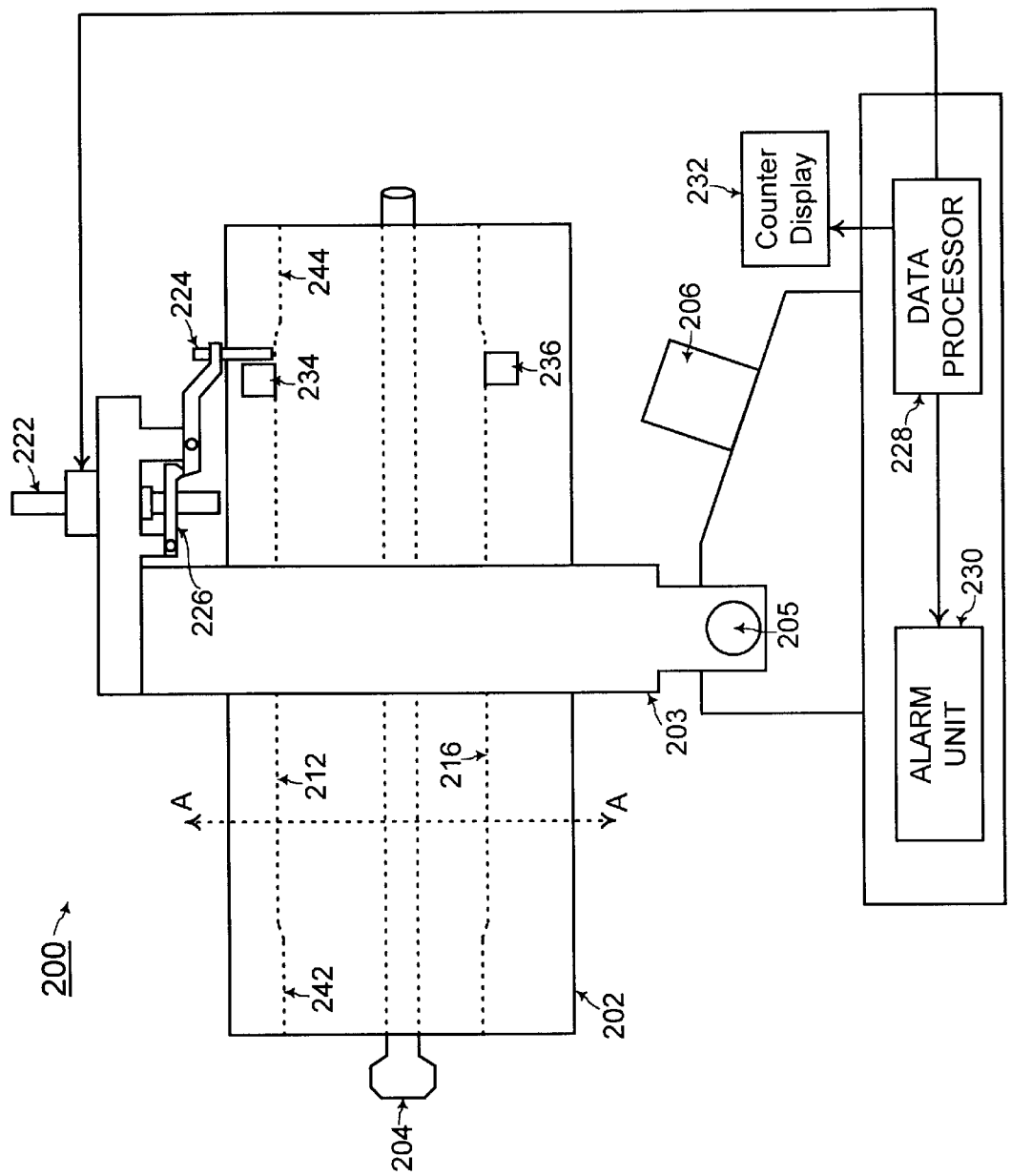
FIG. 3 shows components of an apparatus for automatically controlling transfer of a predetermined number of IC packages from tube to tube for various types of IC packages, according to one embodiment of the present invention.

Referring to FIG. 3, an apparatus 200 automatically controls the tube to tube transfer of a predetermined number of IC packages, according to an embodiment of the present invention. The apparatus 200 includes a turret 202 having a plurality of IC package tracks. The turret 202 is mounted on a turret mount 203, and a spindle 204 is disposed substantially through the center of the turret 202. The turret mount 203 may swing about a pivot 205, and when the turret mount 203 is swung down such that the turret 202 is at a slant, a turret support 206 supports the turret 202.

Figure 4:
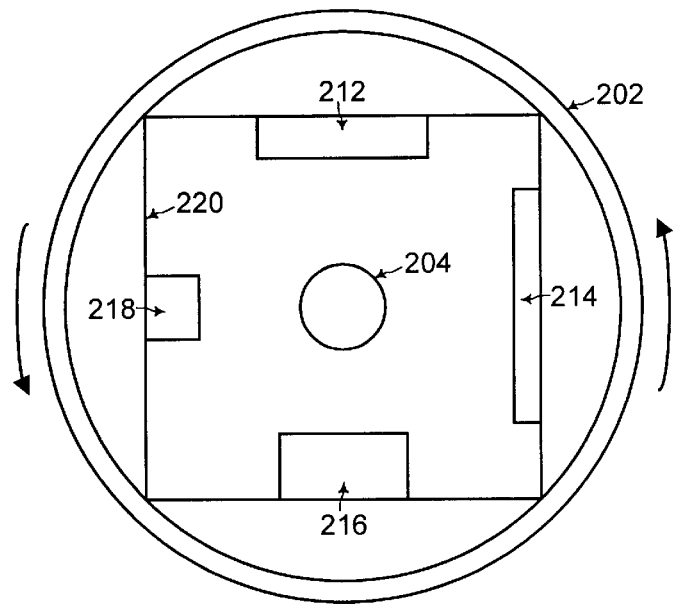
FIG. 4 shows a cross sectional view of a turret in the apparatus of FIG. 3 having a plurality of IC package tracks for transfer of various types of IC packages with rotation of the turret, according to one embodiment of the present invention.

Referring to FIGS. 3 and 4, the turret 202 has a substantially cylindrical shape according to one embodiment of the present invention. FIG. 4 shows a cross sectional view of the turret 202 across the dashed line A—A in FIG. 3. Referring to FIGS. 3 and 4, the turret 202 includes a plurality of IC package tracks which are openings through the length of the turret 202. Referring to FIG. 4, the turret 202 includes a first IC package track 212, a second IC package track 214, a third IC package track 216, and a fourth IC package track 218. The length of each of the IC package tracks 212, 214, 216, and 218 is disposed along the length of the turret 202. Each of the IC package tracks 212, 214, 216, and 218 has respective dimensions to fit to dimensions of a corresponding type of IC package. In addition, each of the IC package tracks 212, 214, 216, and 218 is disposed at a respective location around a perimeter area 220 of the turret 202.

Referring to FIG. 3, the apparatus 200 further includes a singulator 222 and a stopper gate 224. The singulator 222 is coupled to the stopper gate 224 by a motion translation bar 226. A data processor 228 is coupled to the singulator 222 for controlling the up and down movement of the singulator 222. The data processor 228 is coupled to an alarm unit 230 and a counter display 232.

Referring to FIGS. 3 and 4, the turret 202 may be rotated about the spindle 204 until a chosen IC package track of the plurality of IC package tracks 212, 214, 216, and 218 faces the singulator 222 and the stopper gate 224. In the example of FIG. 3, the first IC package track 212 is the chosen IC package track that faces the singulator 222 and the stopper gate 224. The chosen IC package track depends on the dimensions of the IC packages to be transferred tube to tube. The chosen IC package track has dimensions that fit to the dimensions of each of the IC packages to be transferred.

In addition, each of the plurality of IC package tracks 212, 214, 216, and 218 includes a respective opening that is situated near the stopper gate 224 when an IC package track is the chosen IC package track. Referring to FIG. 3 which shows the first IC package track 212 and the third IC package track 216 within the turret 202, a first opening 234 is disposed through the first IC package track 212, and a third opening 236 is disposed through the third IC package track 216. When any of the openings 234 and 236 are situated near the stopper gate 224, an optical sensor is aligned through such an opening near the stopper gate 224 for determining that an IC package is stopped at the stopper gate 224 with proper orientation as will be described more fully herein.

Furthermore, each of the plurality of IC package tracks 212, 214, 216, and 218 includes an input slot and an output slot which are slight depressions at the ends of the IC package tracks for placement of IC package tubes. Referring to FIG. 3, the chosen IC package track 212 for example includes an input slot 242 and an output slot 244.

Figure 5:
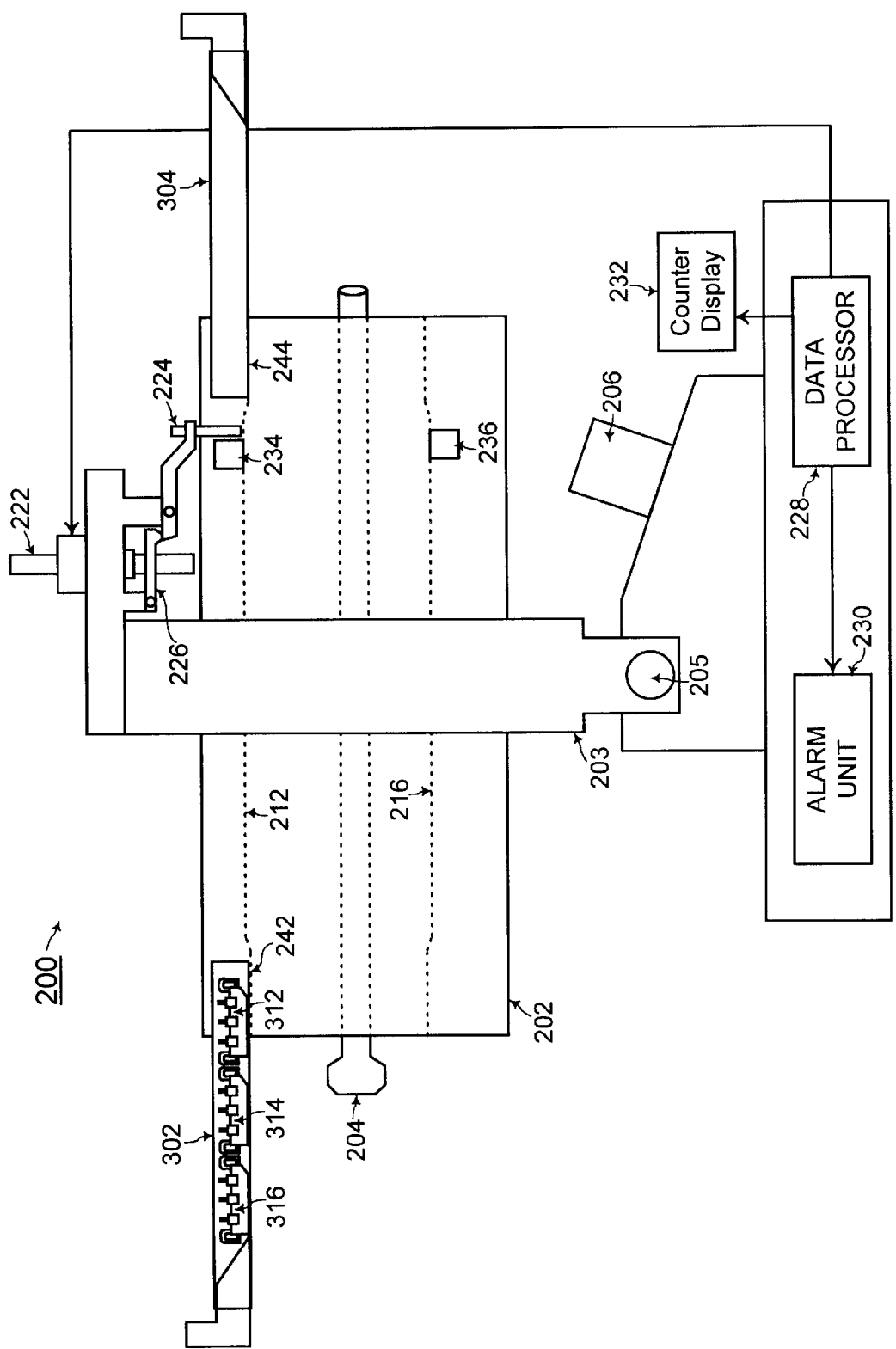
FIG. 5 shows placement of a first IC package tube and a second IC package tube on the apparatus of FIG. 3 with the first IC package tube having the IC packages to be transferred to the second IC package tube, according to one embodiment of the present invention.

Referring to FIG. 5, during operation of the apparatus 200, the turret 202 is initially positioned to be substantially horizontal. A first IC package tube 302 is placed on the input slot 242 at one end of the chosen IC package track 212, and a second IC package tube 304 is placed on an output slot 244 at the other end of the chosen IC package track 212. The first IC package tube 302 includes a plurality of IC packages including a first IC package 312, a second IC package 314, and a third IC package 316. IC package tubes typically include more numerous IC packages, but three IC packages are illustrated within the first IC package tube 302 in FIG. 5 for clarity of illustration. A predetermined number of IC packages from the plurality of IC packages 312, 314, and 316 of the first IC package tube 302 is to be transferred to the second IC package tube 304.

Figure 6:
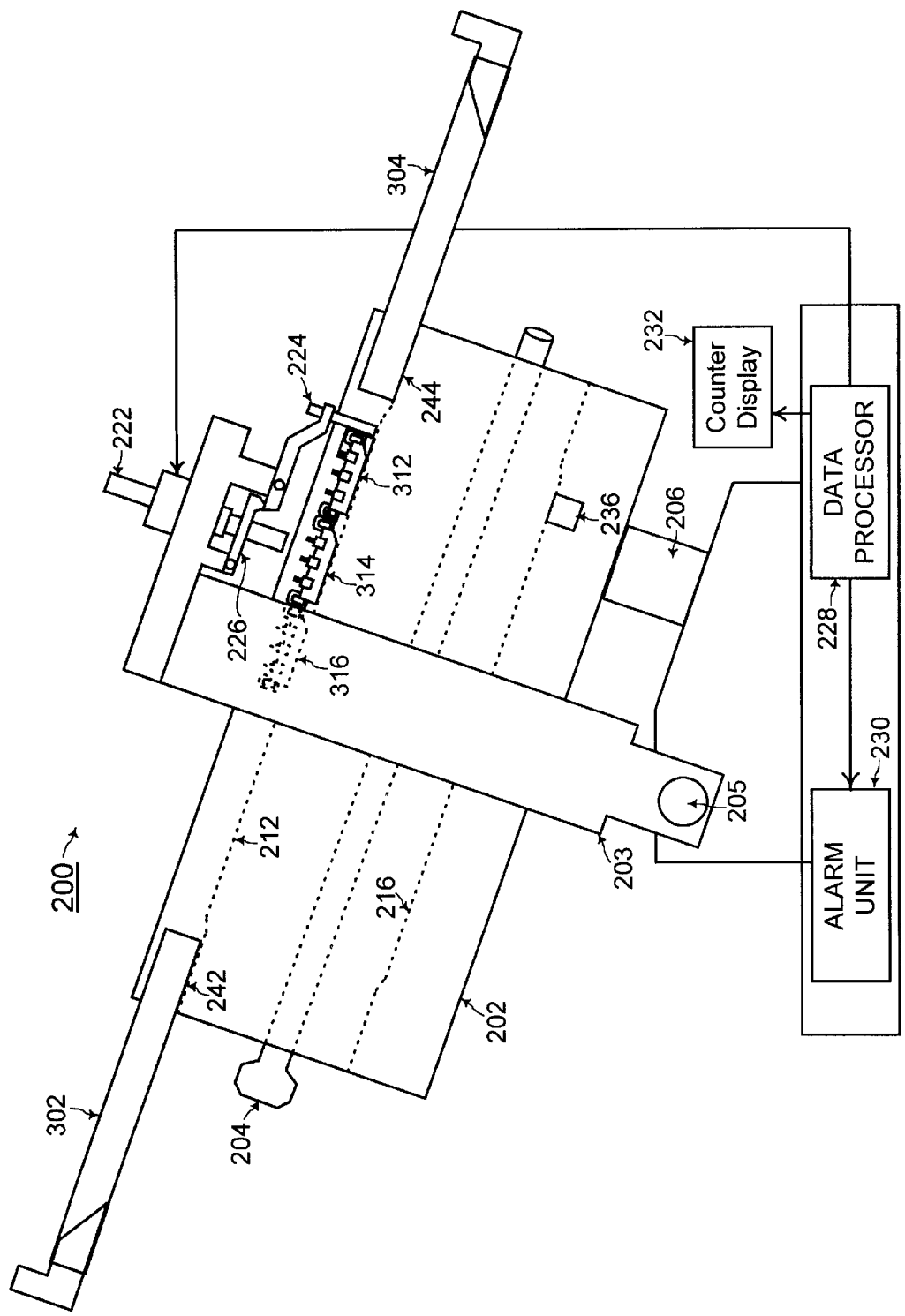
FIG. 6 illustrates placement of the first IC package tube, the IC package track, and the second IC package tube at a slant such that the IC packages slide out from the first IC package tube along the IC package track, and toward the second IC package tube, according to one embodiment of the present invention.

Referring to FIG. 6, after the first IC package tube 302 is placed on the input slot 242 and the second IC package tube 304 is placed on the output slot 244 of the chosen IC package track 212, the turret mount 203 is swung about the pivot 205 such that the first IC package tube 302, the turret 202, and the second IC package tube 304 are tilted to a slant. With such a slant, the plurality of IC packages 312, 314, and 316 slides out of the first IC package tube 302, along the chosen IC package track 212, and toward the second IC package tube 304. The input slot 242 and the output slot 244 may include mechanisms for holding the respective IC package tube placed therein even at the slant. Such mechanisms are known to one of ordinary skill in the art of mechanics.

Further referring to FIG. 6, the stopper gate 224 is disposed above the chosen IC package track 212 between the first IC package tube 302 and the second IC package tube 304. Initially, the stopper gate 224 is dropped down toward the chosen IC package track 212 to block the IC packages 312, 314, and 316 from entering into the second IC package tube 304. The IC packages 312, 314, and 316 are lined up linearly along the chosen IC package track 212 against the stopper gate 224 with the first IC package 312 being a bottom IC package abutting the stopper gate 224.

Figure 7:
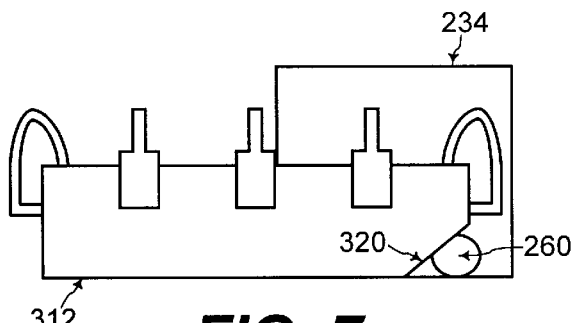
FIG. 7 illustrates an IC package being transferred with proper orientation as determined by an optical sensor aligned to the tapered facet of the IC package, according to one embodiment of the present invention.

Referring to FIGS. 6 and 7, when the bottom IC package 312 is abutting the stopper gate 224, the orientation of the bottom IC package 312 is checked with an optical sensor 260 disposed to be aligned with the opening 234 near the chosen IC package track 212. The optical sensor 260 includes a light source such as a LED (light emitting diode) that generates a light toward the chosen IC package track 212 through the opening 234 and includes a light sensor such as a photo diode for detecting the reflection of such light.

Referring to FIG. 7, if the bottom IC package 312 is positioned on the chosen IC package track 212 with proper orientation such that a tapered facet 320 of the bottom IC package 312 faces toward the bottom right, then the light generated by the optical sensor 260 passes through the opening 234 without being reflected by the bottom IC package 312. On the other hand, referring to FIG. 8, if the bottom IC package 312 is positioned on the chosen IC package track 212 with improper orientation such that the tapered facet 320 of the bottom IC package 312 does not face toward the bottom right, then the light generated by the optical sensor 260 is reflected by the bottom IC package 312.

Figure 8:
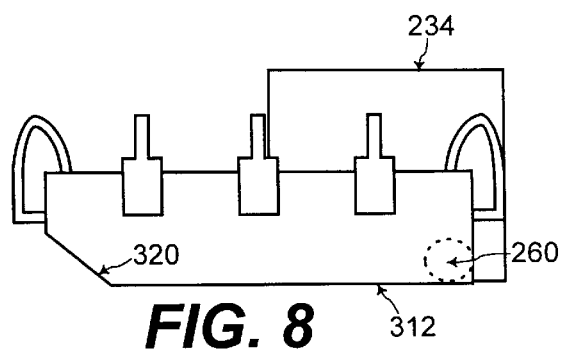
FIG. 8 illustrates an IC package being transferred with improper orientation as determined by the optical sensor misaligned to the tapered facet of the IC package, according to one embodiment of the present invention.

Referring to FIGS. 6, 7, and 8, the optical sensor 260 is coupled to the data processor 228. When the optical sensor 260 does not detect sufficient light reflected by the bottom IC package 312, the data processor 228 determines that the bottom IC package 312 is positioned on the chosen IC package track 212 with proper orientation to be passed to the second IC package tube 304 with proper orientation. On the other hand, when the optical sensor 260 does detect sufficient light reflected by the bottom IC package 312, the data processor 228 determines that the bottom IC package 312 is positioned on the chosen IC package track 212 with improper orientation. In that case, the data processor 228 controls the alarm unit 230 to generate a warning signal to notify an operator that an IC package may be passed to the second IC package tube 304 with wrong orientation. Alarm units which generate visual and/or audible warning signals are known to one of ordinary skill in the art of electronics.

Figure 9:
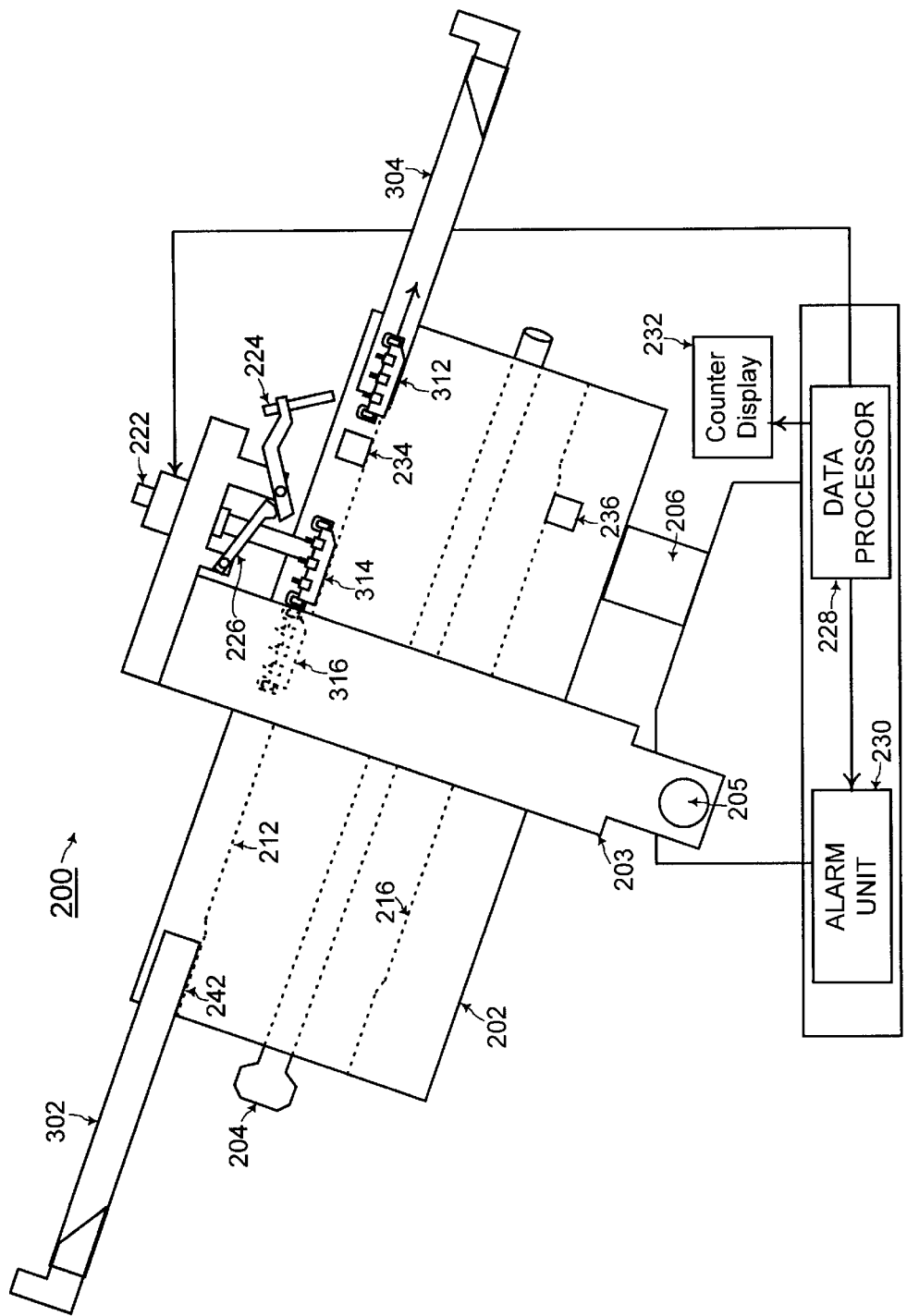
FIGS. 9, 10, 11, and 12 illustrate the control of an singulator and a stopper gate by a data processor in the apparatus of FIG. 3 for automated control of the transfer of the predetermined number of IC packages to the second IC package tube, according to an embodiment of the present invention.

Referring to FIGS. 6 and 9, if the bottom IC package 312 is placed on the chosen IC package track 212 with proper orientation, the data processor 228 controls the singulator 222 to drop down to hold a subsequent IC package which is the second IC package 314 in FIGS. 6 and 9 adjacent the bottom IC package 312. When the singulator 222 drops down, the singulator pushes down on the motion translator bar 226 which in turn pushes on the stopper gate 224 to lift up the stopper gate 224.

When the stopper gate 224 is lifted up, the bottom IC package 312 is allowed to slide down along the chosen IC package track 212 to enter the second IC package tube 304. As the stopper gate is lifted up and as the bottom IC package 312 is transferred to the second IC package tube 304, the singulator 222 is dropped down to hold the subsequent IC package 314 in place such that the subsequent IC package 314 is not transferred to the second IC package tube 304 as the bottom IC package 312 is transferred to the second IC package tube 304. With the transfer of the bottom IC package 312 to the second IC package tube 304, the data processor 228 increments a count of the number of IC packages transferred from the first IC package tube 302 to the second IC package tube 304.

Figure 10:
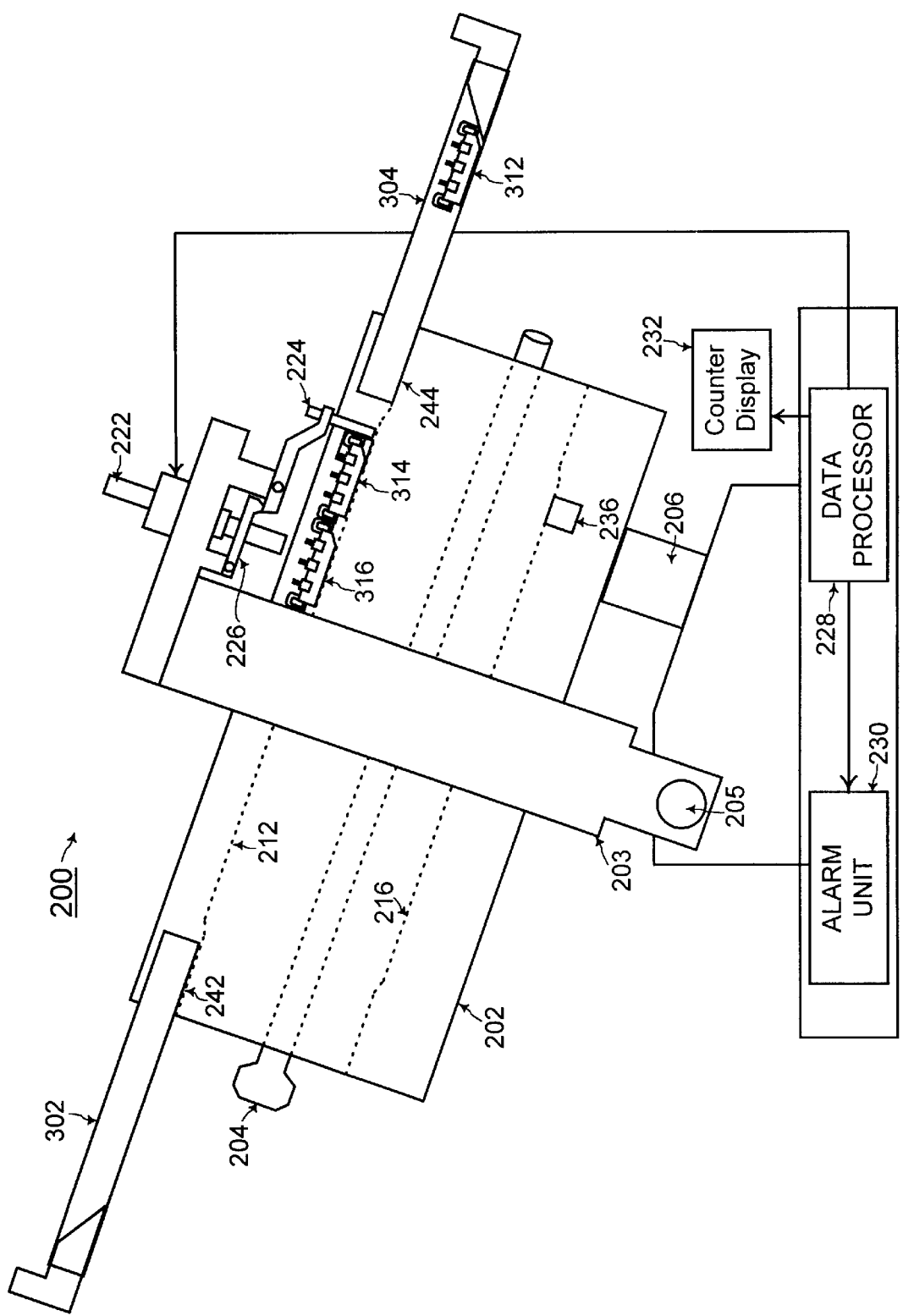

Referring to FIGS. 9 and 10, after the transfer of the bottom IC package 312 to the second IC package tube 304, the data processor 228 controls the singulator 222 to lift back up. As the singulator 222 lifts back up, the motion translation bar 226 no longer pushes on the stopper gate 224 such that the stopper gate 224 drops back down toward the chosen IC package track 212. When the singulator 222 lifts back up, the subsequent IC package 314 slides down along the chosen IC package track 212 such that the subsequent IC package 314 becomes the bottom IC package that abuts the stopper gate 224. The third IC package 316 becomes the subsequent IC package adjacent the bottom IC package 314.

Figure 11:
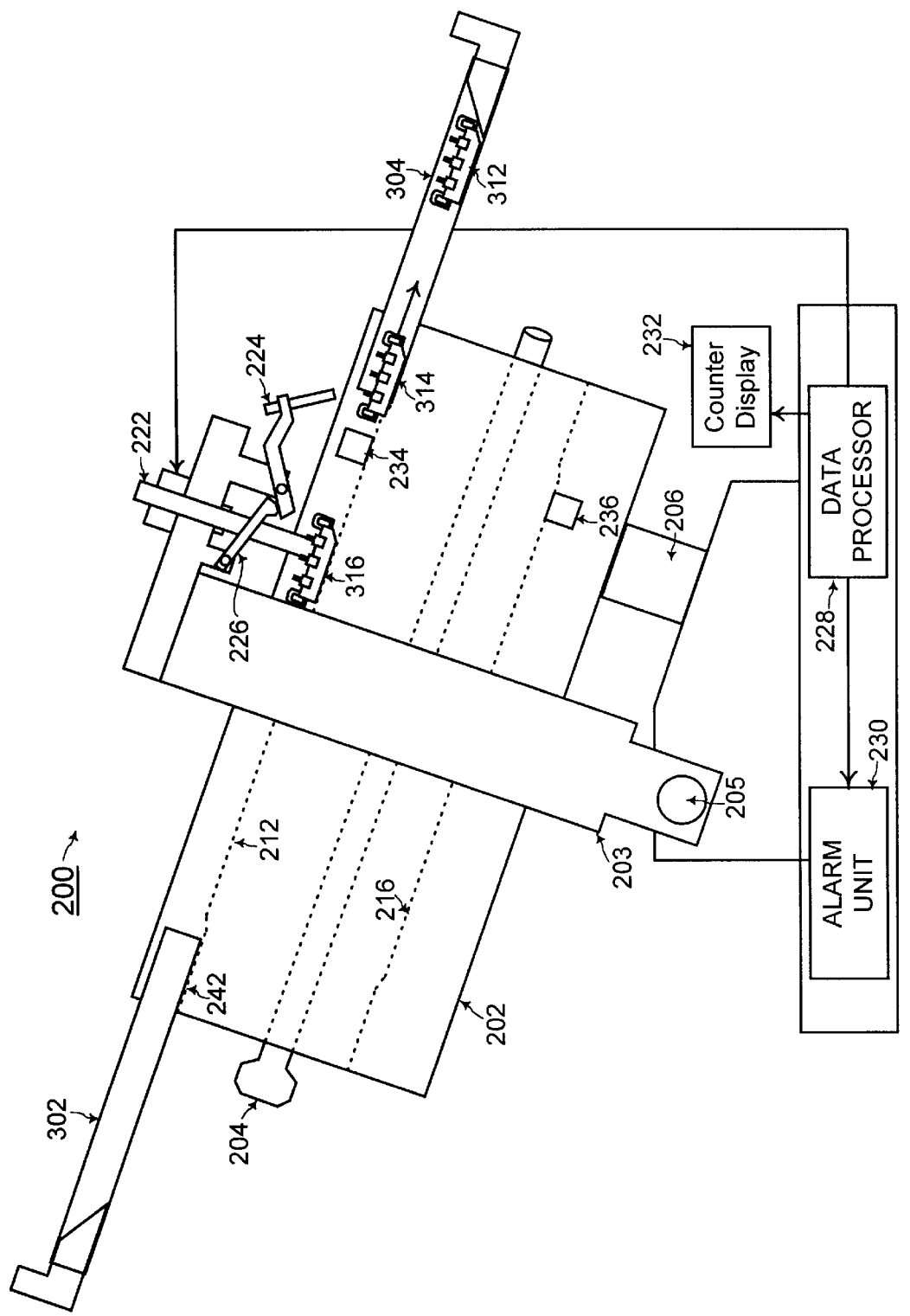

Referring to FIGS. 7 and 8, the orientation of this bottom IC package 314 is also checked by the optical sensor 260. Referring to FIGS. 10 and 11, if this bottom IC package 314 is placed on the chosen IC package track 212 with proper orientation, the data processor 228 controls the singulator 222 to drop down to hold the subsequent IC package 316. When the singulator 222 drops down, the singulator pushes down on the motion translator bar 226 which in turn pushes on the stopper gate 224 to lift up the stopper gate 224.

When the stopper gate 224 is lifted up, the bottom IC package 314 is allowed to slide down along the chosen IC package track 212 to enter the second IC package tube 304. As the stopper gate is lifted up and as the bottom IC package 314 is transferred to the second IC package tube 304, the singulator 222 is dropped down to hold the subsequent IC package 316 in place such that the subsequent IC package 316 is not transferred to the second IC package tube 304 as the bottom IC package 314 is transferred to the second IC package tube 304. With the transfer of the bottom IC package 314 to the second IC package tube 304, the data processor 228 increments the count of the number of IC packages transferred from the first IC package tube 302 to the second IC package tube 304.

Figure 12:
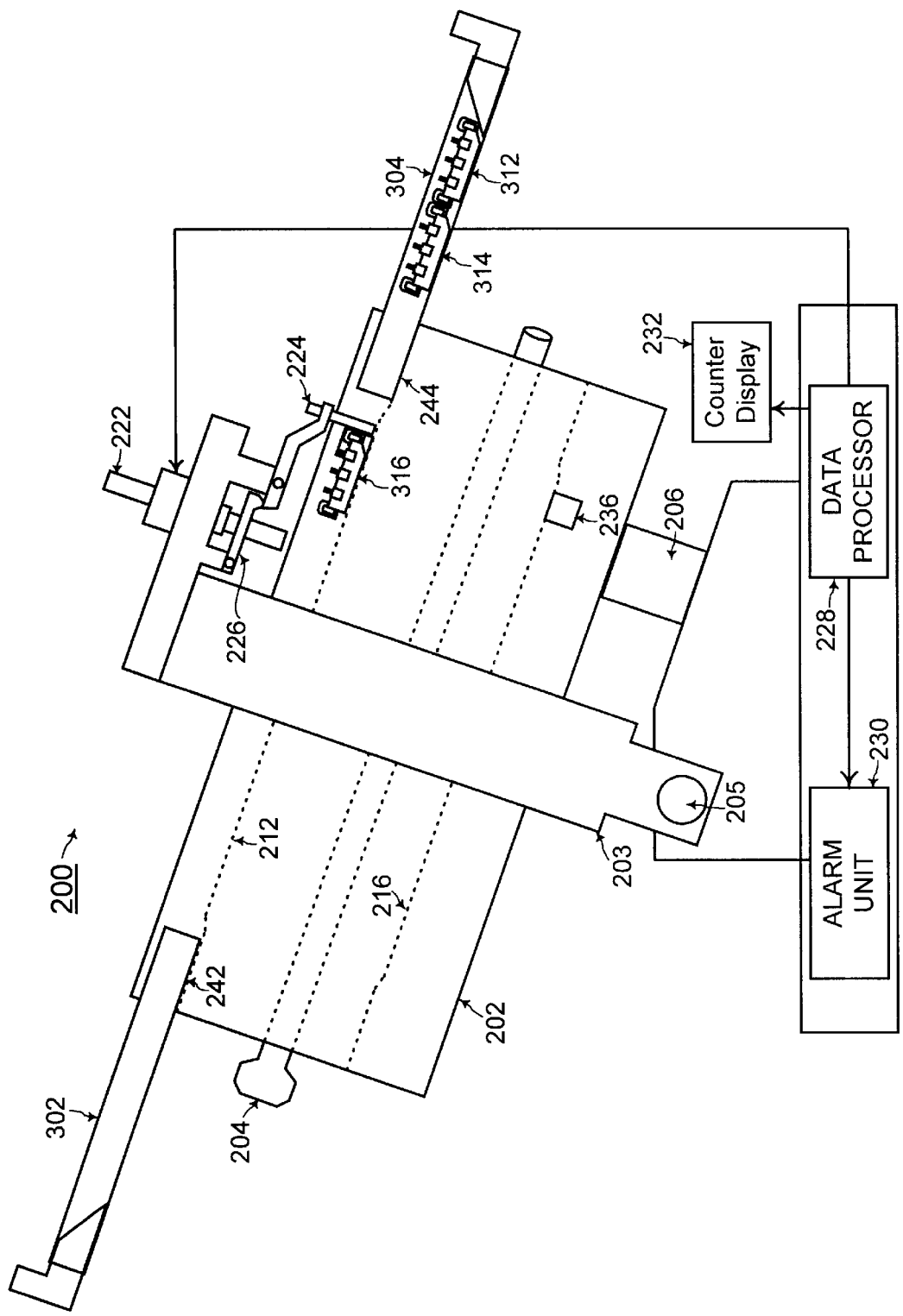

Referring to FIGS. 11 and 12, after the transfer of the bottom IC package 314 to the second IC package tube 304, the data processor 228 controls the singulator 222 to lift back up. As the singulator 222 lifts back up, the motion translation bar 226 no longer pushes on the stopper gate 224 such that the stopper gate 224 drops back down toward the chosen IC package track 212. When the singulator 222 lifts back up, the subsequent IC package 316 slides down along the chosen IC package track 212 such that the subsequent IC package 316 becomes the bottom IC package that abuts the stopper gate 224.

In this manner, the data processor 228 repeats the dropping down and lifting up process of the singulator 222 and the stopper gate 224 until a predetermined number of IC packages have been transferred from the first IC package tube 302 to the second IC package tube 304. The number of IC packages transferred from the first IC package tube 302 to the second IC package tube 304 is kept track of by the data processor 228 as described herein. The data processor may display this number on the counter display 232. Display devices are known to one of ordinary skill in the art of electronics.

Referring to FIG. 12, assume that the predetermined number of IC packages to be transferred from the first IC package tube 302 to the second IC package tube 304 is two of the three IC packages 312, 314, and 316 that were contained within the first IC package tube 302. In that case, after the two IC packages 312 and 314 have been transferred to the second IC package tube 304, as illustrated in FIG. 12, the data processor 228 controls the singulator 222 and the stopper gate 224 to not transfer any more IC packages to the second IC package tube 304. The data processor 228 may then generate a warning signal via the alarm unit 230 that the predetermined number of IC packages has already been transferred to the second IC package tube 304.

In that case, an operator may swing the turret 202 about the pivot 205 back to the horizontal position and remove the first IC package tube 302 from the input slot 242 and the second IC package tube 304 from the output slot 244. Referring to FIG. 4, for transfer of another type of IC packages having different dimensions, the turret 202 may be rotated about the spindle 204 such that another one of the IC package tracks 216, 218, or 214 becomes the chosen IC package track having dimensions that fit to the dimensions of the other type of IC packages.

In this manner, the data processor 228 controls the singulator 222 and the stopper gate 224 disposed near the chosen IC package track to lift up or drop down for automatically controlling the number of IC packages transferred tube to tube. In another embodiment of the present invention, the chosen IC package track is part of a turret having a plurality of IC package tracks. Each IC package track has respective dimensions to fit to dimensions of a corresponding type of IC package. The turret is rotated about the length of the turret until the chosen IC package track faces the stopper gate and the singulator. In this manner, the IC package track corresponding to a particular type of IC packages is rapidly set by simply rotating the turret.

The foregoing is by way of example only and is not intended to be limiting. For example, the present invention is described for an example IC package and an example turret. However, the present invention may advantageously be practiced with other shapes of IC packages and turrets, as would be apparent to one of ordinary skill in the art from the description herein.

Furthermore, as will be understood by those skilled in the art, the structures described herein may be made or used in the same way regardless of their position and orientation. Accordingly, it is to be understood that terms and phrases such as "top" and "bottom" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. An apparatus for transferring a predetermined number of IC (integrated circuit) packages from a first IC package tube to a second IC package tube, the apparatus comprising:

a chosen IC package track having dimensions that fit to dimensions of each of said IC packages, wherein said first IC package tube is placed on a first end of said chosen IC package track, and wherein said second IC package tube is placed on a second end of said chosen IC package track;

a stopper gate disposed above said chosen IC package track between said first end and said second end of said chosen IC package track;

wherein said first IC package tube, said chosen IC package track, and said second IC package tube are tilted to a slant with said first IC package tube being disposed toward a top of said slant and with said second IC package tube being disposed toward a bottom of said slant such that said IC packages slide out from said first IC package tube, down along said chosen IC package track, and toward said second IC package tube;

and wherein said stopper gate is dropped down toward said chosen IC package track to block said IC packages from entering into said second IC package tube such that said IC packages are lined up linearly along said chosen IC package track against said stopper gate with a bottom IC package abutting said stopper gate;

a data processor, coupled to said stopper gate, for controlling said stopper gate to lift up to pass said bottom IC package to said second IC package tube; and a singulator, coupled to said stopper gate and to said data processor, wherein said data processor controls said singulator to drop down to hold a subsequent IC package adjacent said bottom IC package when said stopper gate is lifted up to pass said bottom IC package such that said subsequent IC package does not pass to said second IC package tube as said bottom IC package is passed to said second IC package tube;

and wherein said data processor controls said stopper gate to drop back down and said singulator to lift back up after said bottom IC package is passed to said second IC package tube such that said subsequent IC package becomes said bottom IC package abutting said stopper gate;

and wherein said data processor controls said stopper gate and said singulator to repeat said lifting up and said dropping down process until said predetermined number of IC packages are passed to said second IC package tube.

2. The apparatus of claim 1, wherein said stopper gate is coupled to said singulator with a motion translation bar such that when said singulator drops down, said motion translation bar pushes on said stopper gate to lift up, and when said singulator is lifted up, said motion translator bar no longer pushes on said stopper gate such that said stopper gate drops down.

3. The apparatus of claim 1, wherein said chosen IC package track is part of a turret having a plurality of IC package tracks, and wherein a length of each IC package track is disposed along a length of said turret, and wherein each IC package track is disposed at a respective location around a perimeter area of said turret, and wherein each IC package track has respective dimensions to fit to dimensions of a corresponding type of IC package, and wherein said length of said turret is disposed between said first IC package tube and said second IC package tube, and wherein said turret is rotated about said length of said turret until said chosen IC package track faces said stopper gate and said singulator.

4. The apparatus of claim 3, wherein each IC package track has an input slot for holding said first IC package tube at a first end of an IC package track and an output slot for holding said second IC package tube at a second end of said IC package track when said IC package track is said chosen IC package track.

5. The apparatus of claim 4, wherein said turret is mounted to a turret mount that swings such that said chosen IC package track is initially horizontal as said first IC package tube is placed on said input slot of said chosen IC package track and as said second IC package tube is placed on said output slot of said chosen IC package track, and wherein said turret mount swings to said slant after said first IC package tube is placed on said input slot and said second IC package tube is placed on said output slot such that said first IC package tube, said chosen IC package track, and said second IC package tube are tilted to said slant.

6. The apparatus of claim 1, further including:
  an optical sensor disposed near said stopper gate for determining that said bottom IC package is abutting said stopper gate with proper orientation; and
  an alarm for generating a warning signal when said bottom IC package is abutting said stopper gate with improper orientation.

7. The apparatus of claim 1, further comprising:
  a counter display for displaying a number of IC packages passed to said second IC package tube, wherein said data processor keeps count of said number of IC packages passed to said second IC package tube.

8. A method for transferring a predetermined number of IC (integrated circuit) packages from a first IC package tube to a second IC package tube, the method including the steps of:
  A. placing a chosen IC package track between said first IC package tube and said second IC package tube, said chosen IC package track having dimensions that fit to dimensions of each of said IC packages, wherein said first IC package tube is placed on a first end of said chosen IC package track, and wherein said second IC package tube is placed on a second end of said chosen IC package track;
  wherein said first IC package tube, said chosen IC package track, and said second IC package tube are tilted to a slant with said first IC package tube being disposed toward a top of said slant and with said second IC package tube being disposed toward a bottom of said slant such that said IC packages slide out from said first IC package tube, down along said chosen IC package track, and toward said second IC package tube;
  B. dropping down a stopper gate toward said chosen IC package track between said first end and said second end of said chosen IC package track to block said IC packages from entering into said second IC package tube such that said IC packages are lined up linearly along said chosen IC package track against said stopper gate with a bottom IC package abutting said stopper gate;
  C. controlling, by a data processor, said stopper gate to lift up to pass said bottom IC package to said second IC package tube;
  D. controlling, by a data processor, a singulator coupled to said stopper gate, to drop down to hold a subsequent IC package adjacent said bottom IC package when said stopper gate is lifted up to pass said bottom IC package such that said subsequent IC package does not pass to said second IC package tube as said bottom IC package is passed to said second IC package tube;
  E. controlling, by said data processor, said stopper gate to drop back down and said singulator to lift back up after said bottom IC package is passed to said second IC package tube such that said subsequent IC package becomes said bottom IC package abutting said stopper gate; and
  F. controlling, by said data processor, said stopper gate and said singulator to repeat said lifting up and said dropping down process until said predetermined number of IC packages are passed to said second IC package tube.

9. The method of claim 8, wherein said stopper gate is coupled to said singulator with a motion translation bar such that when said singulator drops down, said motion translation bar pushes on said stopper gate to lift up, and when said singulator is lifted up, said motion translator bar no longer pushes on said stopper gate such that said stopper gate drops down.

10. The method of claim 8, wherein said chosen IC package track is part of a turret having a plurality of IC package tracks, and wherein a length of each IC package track is disposed along a length of said turret, and wherein each IC package track is disposed at a respective location around a perimeter area of said turret, and wherein each IC package track has respective dimensions to fit to dimensions of a corresponding type of IC package, and wherein said length of said turret is disposed between said first IC package tube and said second IC package tube, and wherein said step A further includes the step of:
  rotating said turret about said length of said turret until said chosen IC package track faces said stopper gate and said singulator.

11. The method of claim 10, wherein each IC package track has an input slot for holding said first IC package tube at a first end of an IC package track and an output slot for holding said second IC package tube at a second end of said IC package track when said IC package track is said chosen IC package track.

12. The method of claim 11, wherein said turret is mounted to a turret mount that swings, the method further including the step of:

placing said chosen IC package track at a horizontal position as said first IC package tube is placed on said input slot of said chosen IC package track and as said second IC package tube is placed on said output slot of said chosen IC package track; and swinging said turret to said slant after said first IC package tube is placed on said input slot and said second IC package tube is placed on said output slot such that said first IC package tube, said chosen IC package track, and said second IC package tube are tilted to said slant.

13. The method of claim 8, further including the steps of:

determining that said bottom IC package is abutting said stopper gate with proper orientation; and generating a warning signal when said bottom IC package is abutting said stopper gate with improper orientation.

14. The method of claim 8, further including the step of:

displaying a number of IC packages passed to said second IC package tube, wherein said data processor keeps count of said number of IC packages passed to said second IC package tube.

15. An apparatus for transferring a predetermined number of IC (integrated circuit) packages from a first IC package tube to a second IC package tube, the apparatus comprising:

an IC package passing mechanism for passing said predetermined number of IC packages from said first IC package tube to said second IC package tube as said predetermined number of IC packages travel along a chosen IC package track; and a turret having said chosen IC package track as one of a plurality of IC package tracks on said turret, wherein a length of each IC package track is disposed along a length of said turret, and wherein each IC package track is disposed at a respective location around a perimeter area of said turret, and wherein each IC package track has respective dimensions to fit to dimensions of a corresponding type of IC package, and wherein said length of said turret is disposed between said first IC package tube and said second IC package tube, and wherein said turret is rotated about said length of said turret until said chosen IC package track faces said IC package passing mechanism such that said predetermined number of IC packages travel along said chosen IC package track.

16. The apparatus of claim 15, wherein said IC package passing mechanism comprises:

a stopper gate disposed above said chosen IC package track between said first IC package tube and said second IC package tube;

wherein said first IC package tube, said chosen IC package track, and said second IC package tube are tilted to a slant with said first IC package tube being disposed toward a top of said slant and with said second IC package tube being disposed toward a bottom of said slant such that said IC packages slide out from said first IC package tube, down along said chosen IC package track, and toward said second IC package tube;

and wherein said stopper gate is dropped down toward said chosen IC package track to block said IC packages from entering into said second IC package tube such that said IC packages are lined up linearly along said chosen IC package track against said stopper gate with a bottom IC package abutting said stopper gate;

a data processor, coupled to said stopper gate, for controlling said stopper gate to lift up to pass said bottom IC package to said second IC package tube; and a singulator, coupled to said stopper gate and to said data processor, wherein said data processor controls said singulator to drop down to hold a subsequent IC package adjacent said bottom IC package when said stopper gate is lifted up to pass said bottom IC package such that said subsequent IC package does not pass to said second IC package tube as said bottom IC package is passed to said second IC package tube;

and wherein said data processor controls said stopper gate to drop back down and said singulator to lift back up after said bottom IC package is passed to said second IC package tube such that said subsequent IC package becomes said bottom IC package abutting said stopper gate;

and wherein said data processor controls said stopper gate and said singulator to repeat said lifting up and said dropping down process until said predetermined number of IC packages are passed to said second IC package tube.

17. The apparatus of claim 16, wherein said stopper gate is coupled to said singulator with a motion translation bar such that when said singulator drops down, said motion translation bar pushes on said stopper gate to lift up, and when said singulator is lifted up, said motion translator bar no longer pushes on said stopper gate such that said stopper gate drops down.

18. The apparatus of claim 15, wherein each IC package track has an input slot for holding said first IC package tube at a first end of an IC package track and an output slot for holding said second IC package tube at a second end of said IC package track when said IC package track is said chosen IC package track.

19. The apparatus of claim 18, wherein said turret is mounted to a turret mount that swings such that said chosen IC package track is initially horizontal as said first IC package tube is placed on said input slot of said chosen IC package track and as said second IC package tube is placed on said output slot of said chosen IC package track, and wherein said turret mount swings to said slant after said first IC package tube is placed on said input slot and said second IC package tube is placed on said output slot such that said first IC package tube, said chosen IC package track, and said second IC package tube are tilted to said slant.

* * * * *